(12) United States Patent
Hsieh et al.

(10) Patent No.: US 11,397,452 B2
(45) Date of Patent: Jul. 26, 2022

(54) DISPLAYS WITH PARTIAL TRANSPARENT AREAS

(71) Applicant: Hewlett-Packard Development Company, L.P., Spring, TX (US)

(72) Inventors: Hsing-Hung Hsieh, Taipei (TW); Alan Man Pan Tam, Spring, TX (US); Ann Alejandro Villegas, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/982,654

(22) PCT Filed: Jul. 31, 2018

(86) PCT No.: PCT/US2018/044592
§ 371 (c)(1),
(2) Date: Sep. 21, 2020

(87) PCT Pub. No.: WO2020/027804
PCT Pub. Date: Feb. 6, 2020

(65) Prior Publication Data
US 2021/0149460 A1    May 20, 2021

(51) Int. Cl.
| | |
|---|---|
| *G09G 5/00* | (2006.01) |
| *G06F 1/18* | (2006.01) |
| *G06F 1/16* | (2006.01) |
| *H01L 27/12* | (2006.01) |
| *H01L 27/32* | (2006.01) |

(52) U.S. Cl.
CPC ............ *G06F 1/189* (2013.01); *G06F 1/1605* (2013.01); *H01L 27/124* (2013.01); *H01L 27/3276* (2013.01)

(58) Field of Classification Search
CPC ..... G06F 1/189; G06F 1/1605; H01L 27/124; H01L 27/3276
See application file for complete search history.

(56) References Cited

U.S. PATENT DOCUMENTS

| | | | |
|---|---|---|---|
| 6,424,326 B2 | 7/2002 | Yamazaki et al. | |
| 7,142,221 B2 | 11/2006 | Sakamaki et al. | |
| 7,808,540 B2 | 10/2010 | Cok | |
| 8,223,188 B2 | 7/2012 | Ryf et al. | |
| 8,642,404 B2 * | 2/2014 | Deng | ......... H01L 27/1288 438/142 |

(Continued)

*Primary Examiner* — Joe H Cheng
(74) *Attorney, Agent, or Firm* — Hanley, Flight & Zimmerman LLC

(57) ABSTRACT

Example displays having transparent areas for cameras are disclosed. An example display has a first source line including a first portion composed of a first material and a second portion composed of a second material different than the first material. A first gate line includes a first portion composed of a third material and a second portion composed of a fourth material, the fourth material being different than the third material. A second gate line includes a first portion composed of the third material and a second portion composed of the fourth material. The first portion of the source line, the first portion of the first gate line, and the first portion of the second gate line define a non-transparent area of the display. The second portion of the source line, the second portion of the first gate line, and second portion of the second gate line define a transparent area of a display.

20 Claims, 11 Drawing Sheets

(56) References Cited

U.S. PATENT DOCUMENTS

| | | | |
|---|---|---|---|
| 9,057,931 B1 | 6/2015 | Baldwin | |
| 9,842,549 B2 | 12/2017 | Musgrave et al. | |
| 2007/0246707 A1* | 10/2007 | Deng | H01L 27/1214 257/57 |
| 2007/0249122 A1 | 10/2007 | Seo et al. | |
| 2009/0009628 A1 | 1/2009 | Janicek | |
| 2011/0050551 A1 | 3/2011 | Ota et al. | |
| 2011/0149139 A1 | 6/2011 | Chang | |
| 2011/0279689 A1 | 11/2011 | Maglaque | |
| 2012/0293762 A1 | 11/2012 | Shin et al. | |
| 2014/0035942 A1 | 2/2014 | Yun et al. | |
| 2016/0118421 A1* | 4/2016 | Xu | H01L 27/124 438/586 |
| 2016/0139474 A1* | 5/2016 | Chen | H01L 27/124 349/106 |
| 2016/0327824 A1* | 11/2016 | Chen | G02F 1/136286 |
| 2017/0084231 A1 | 3/2017 | Chew | |
| 2017/0287992 A1 | 10/2017 | Kwak et al. | |
| 2018/0107241 A1 | 4/2018 | Evans, V et al. | |
| 2019/0037063 A1* | 1/2019 | Zeng | H04M 1/0266 |
| 2020/0020737 A1* | 1/2020 | Jin | G06K 9/22 |
| 2020/0236259 A1* | 7/2020 | Nakamura | G02F 1/133345 |
| 2021/0375174 A1* | 12/2021 | Hsieh | G09G 3/20 |

\* cited by examiner

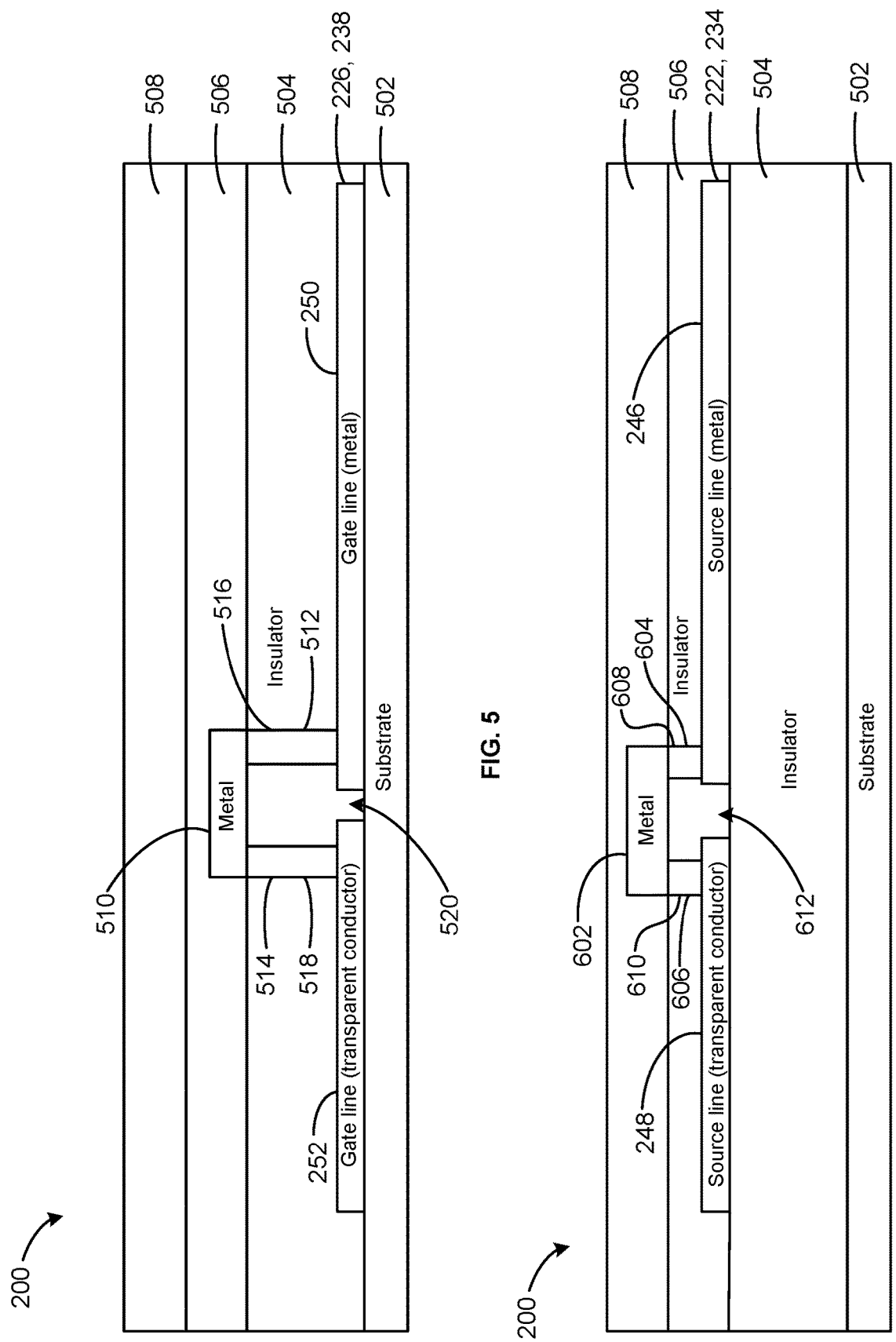

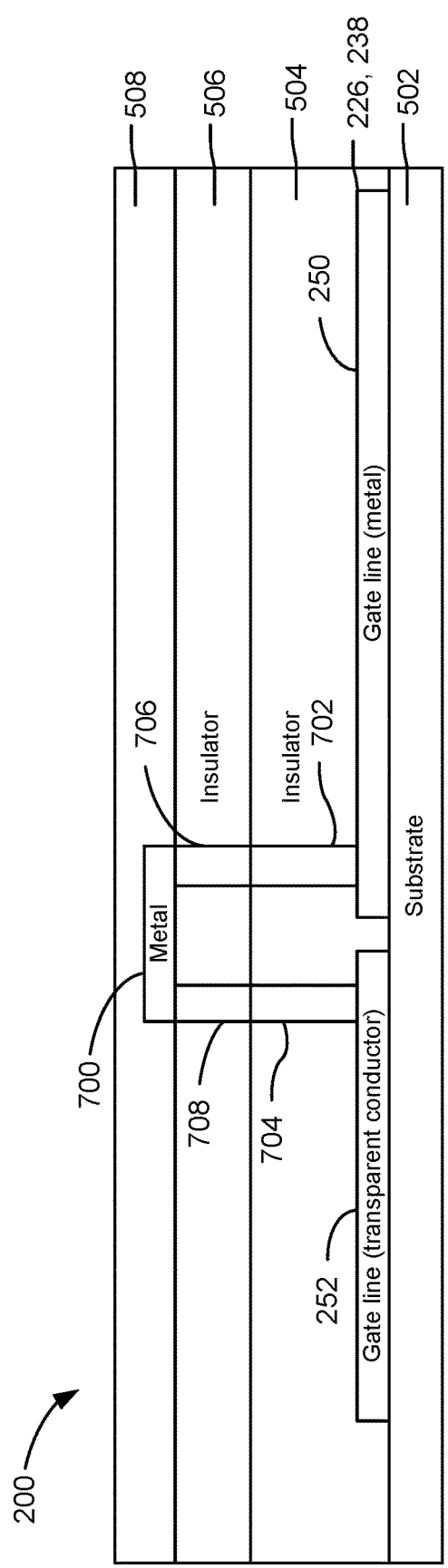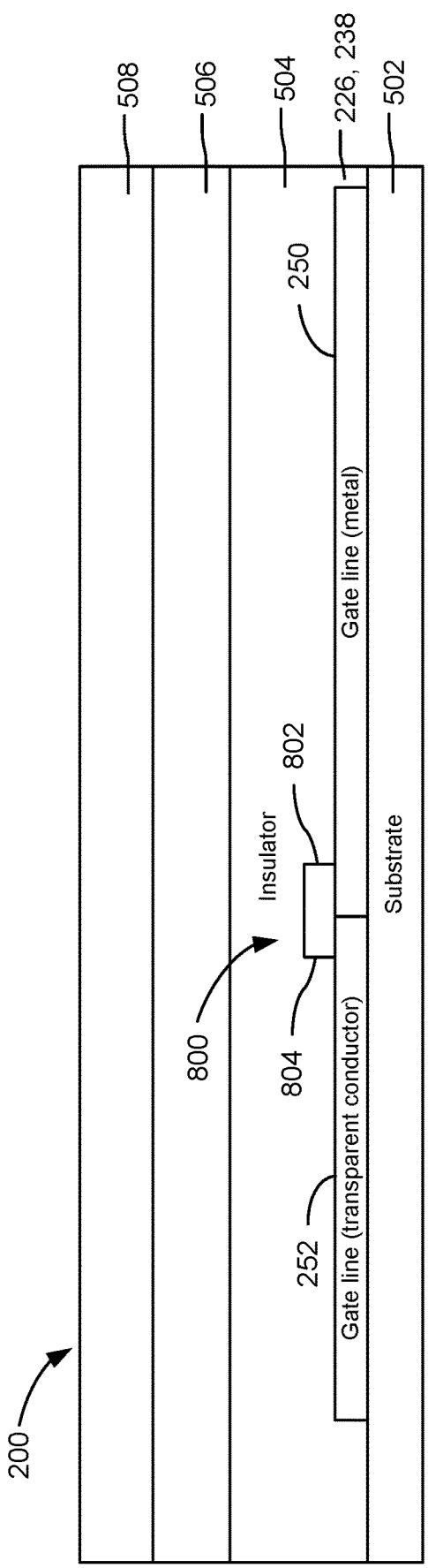

DISPLAYS WITH PARTIAL TRANSPARENT AREAS

CROSS REFERENCE TO RELATED APPLICATIONS

This patent is a national stage application, filed pursuant to 35 U.S.C. § 371, of International Patent Application No. PCT/US2018/044592, filed on Jul. 31, 2018, which is incorporated by reference herein in its entirety.

BACKGROUND

Electronic devices often employ a border adjacent an upper edge of a display to accommodate a camera. Such configuration results in a smaller display area or a larger system form factor. To reduce the border adjacent the display and make the system form factor smaller, some electronic devices employ a notch typically provided adjacent the display to position the cameral around the display. However, the notch interferes with a viewing area of the display and, thus, reduces the display viewing area.

BRIEF DESCRIPTION OF THE DRAWINGS

FIG. 5 is a partial cross-sectional view of a first gate line of the example display of FIG. 2.

FIG. 6 is a partial cross-sectional view of a first source line of example the display of FIG. 2.

FIG. 7 is a partial cross-sectional view of an example connector that can implement the example first gate line of FIG. 5.

FIG. 8 is a partial cross-sectional view of another example connector that can implement the example first gate line of FIG. 5.

Figure 1A:
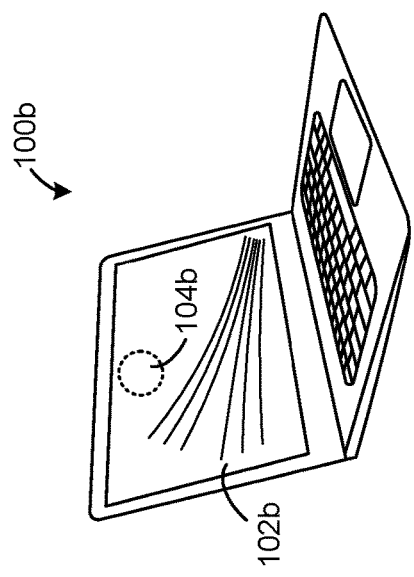
FIGS. 1A-1D are example electronic devices that can employ example displays constructed in accordance with the teachings disclosed herein.

Where ever possible the same reference numbers will be used throughout the drawing(s) and accompanying written description to refer to the same or like parts. The figures are not necessarily to scale and certain features and certain views of the figures can be shown exaggerated in scale or in schematic for clarity and/or conciseness.

DETAILED DESCRIPTION

Certain examples are shown in the identified figures and disclosed in detail herein. Although the following discloses example methods and apparatus, it should be noted that such methods and apparatus are merely illustrative and should not be considered as limiting the scope of this disclosure. In describing these examples, like or identical reference numbers are used to identify the same or similar elements.

Additionally, several examples have been described throughout this specification. Any features from any example can be included with, a replacement for, or otherwise combined with other features from other examples. In other words, the example disclosed herein are not mutually exclusive to each other. As used in this patent, stating that any part is in any way positioned on (e.g., located on, disposed on, formed on, coupled to, etc.) another part, means that the referenced part is either in contact with the other part, or that the referenced part is spaced from the other part with one or more intermediate part(s) located therebetween. Stating that any part is in contact with another part means that there is no intermediate part between the two parts.

As used herein, directional terms, such as "upper," "lower," "top," "bottom," "front," "back," "leading," "trailing," "left," "right," etc. are used with reference to the orientation of the figures being described. Because components of various examples disclosed herein can be positioned in a number of different orientations, the directional terminology is used for illustrative purposes and is not intended to be limiting.

Example displays disclosed herein employ partial transparent areas to accommodate cameras. To this end, example displays disclosed herein eliminate the need for a border adjacent the display and/or eliminate the notch adjacent the display (e.g., an edge of a display) to accommodate a camera. As a result, example displays disclosed herein enable a smaller border adjacent the display and/or significantly increase a viewing area of a display. Additionally, the camera is positioned behind the transparent area of the display. Example displays disclosed herein can be implemented as an organic light emitting diode (OLED).

To provide the transparent area, an example display of this disclosure includes source and gate lines (e.g., conductive traces) that include first portions composed of a first material (e.g., an opaque material, a metallic material) and second portions composed of a second material (e.g., a transparent material) different than the first material. For example, the first material provides a non-transparent or an opaque characteristic to the display and the second material provides a transparent characteristic to the display. In this manner, an electronic device such as a camera can be positioned underneath or behind the transparent portion of the display. The transparent portions are composed of materials that have higher resistivity characteristics than the resistivity characteristics of the opaque portions (e.g., or metallic materials). In some examples, due to the relatively high resistive characteristic of the transparent portions, the second portions of the source and lines are positioned or formed adjacent ends of the respective source and gate lines. In some examples, the transparent portion may be formed adjacent a first edge (e.g., an upper edge, a lower edge, a right edge, a left edge) of the display when the display is oriented in a landscape orientation or a portrait orientation. Thus, in some examples, gate lines formed across the display may include transparent portions adjacent a center of the display. However, due to the high resistivity characteristic(s) of the transparent portion, example displays disclosed herein separate gate lines into a set of first gate lines and a set of second gate lines. In some such examples, the display is provided with a source driver to drive source lines, a first gate driver to drive a set of first gate lines, and a second gate driver to drive a set of second gate lines. To this end, the first gate driver controls a first portion or half of the display and the second gate driver controls a second half of the display. In some such examples, the source lines may include transparent portions adjacent a center of the display and, thus, some example displays disclosed herein include a set of first source lines and a set of second source lines. In some such examples, the display is provided with a gate driver to drive the gate lines, a first source driver to drive the set of first source lines, and a second source driver to drive the set of second source lines. To this end, the first source driver controls a first portion or half of the display and the second source drive controls a second half of the display.

Figure 1B:
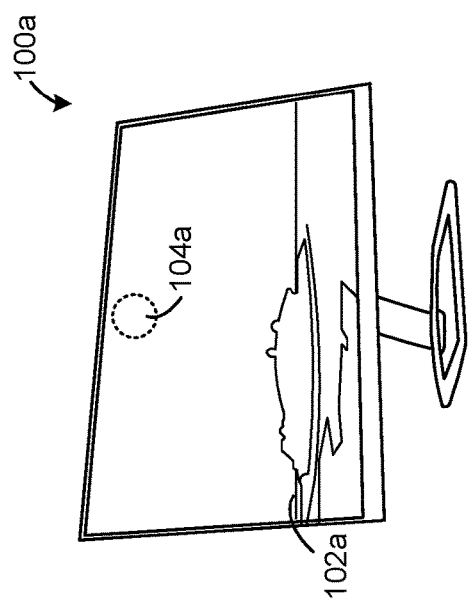
Figure 1C:
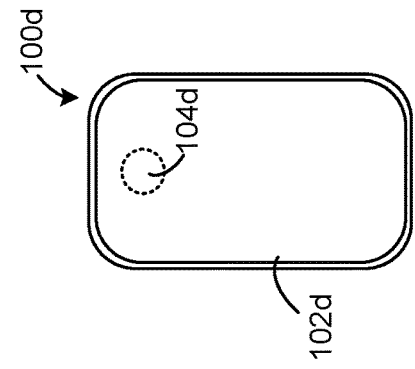
Figure 1D:
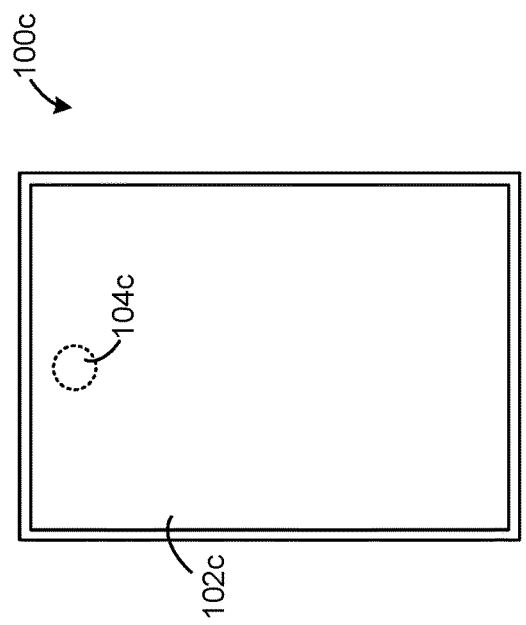

Turning more specifically to the illustrated examples, FIGS. 1A-1D illustrate example electronic devices 100a-d that can be implemented with example displays 102a-d constructed in accordance with the teachings of this disclosure. For example, the electronic device 100a of FIG. 1A is a monitor, the electronic device 100b of FIG. 1B is a notebook computer, the electronic device 100c of FIG. 1C is a tablet, and the electronic device 100d of FIG. 1D is a mobile device. In some examples, the electronic device can include a television, a sign, and/or any other electronic device that has a display. The electronic devices 100a-d include cameras 104a-d positioned underneath transparent portions of the displays 102a-d. For example, the cameras 104a-d are positioned behind the displays 102a-d such that the displays 102a-d overlap the cameras 104a-d.

As used herein, the term "transparent" refers to a quality of a material that allows visible light to pass through, and the term "opaque portion" refers to a quality of a material that allows less amount of visible light to pass through than the transparent portion. In some examples, a transparent portion enables more than 10% of light to pass through. In some examples, a transparent portion enables more than 50% of light to pass through. In some examples, a transparent portion enables between approximately 30% and 80% of light to pass through. In some examples, a translucent material is considered a transparent material. In some examples, an opaque portion prevents more than 90% of light from passing through. Thus, in some examples, an opaque portion does enable the transmission of a low amount of light. In some examples, an opaque portion is considered a non-transparent portion.

Figure 2:
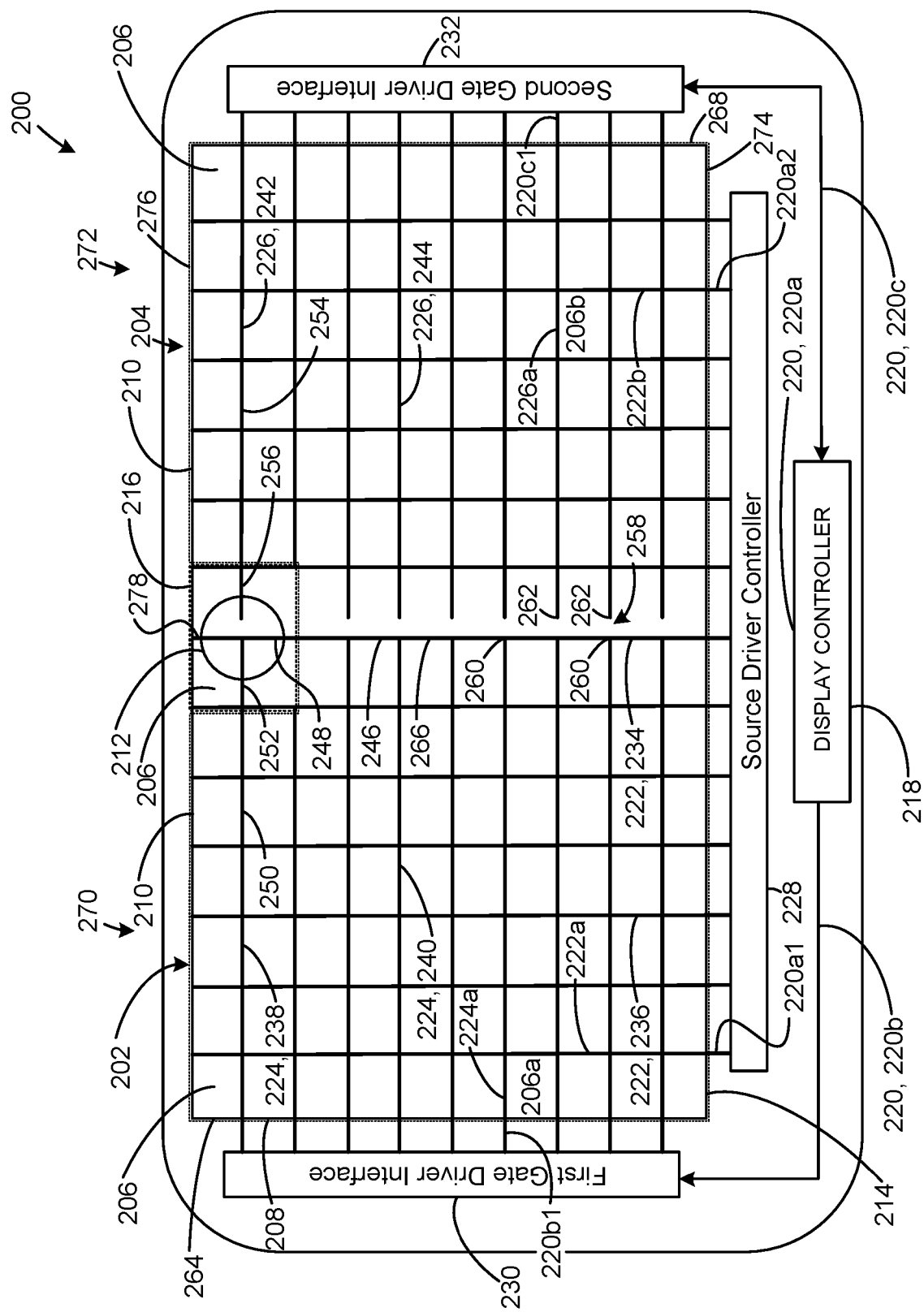
FIG. 2 is a block diagram an example display disclosed herein.

FIG. 2 illustrates an example display 200 that can implement the example displays 102a-d of FIGS. 1A-1D. By way of example, the display 200 of the illustrated example includes an OLED display panel. However, in some examples, the display 200 of the illustrated example can include a light emitting diode (LED) display panel, and/or any other display panel(s) or element(s). In some examples, the display 200 of the illustrated example may include a touch sensitive display panel. As used herein, the term "display" refers to a device and/or a combination of devices that are used to present information in a visual form.

The display 200 of the illustrated example includes a viewing area 202 defined by a pixel array 204. For example, the pixel array 204 can be formed by several layers of material(s), such as a cover/glass layer, a color filter layer, a display layer including light emitting diodes or organic light emitting diodes, a thin film transistor layer, insulator layers, etc. The pixel array 204 of the illustrated example includes a plurality of pixels 206. Specifically, the pixels 206 of the pixel array 204 of the illustrated example are formed in rows 208 and columns 210 (e.g., tens, hundreds, thousands, or more rows and/or columns) and are activated or deactivated in a precise or timed pattern to generate a desired image in the viewing area 202.

Additionally, the display 200 of the illustrated example includes a camera 212. By way of example, the camera 212 of the illustrated example is positioned underneath (e.g., behind) the display 200 (e.g., a display panel). For example, the camera 212 of the illustrated example is positioned between the display 200 (e.g., a substrate of the display 200) and a housing of an electronic enclosure of an electronic device (e.g., the electronic devices 100a-d of FIGS. 1A-1D). In other words, the camera 212 is positioned to capture an image through the display 200.

To enable the camera 212 to capture an image through the display 200, the display 200 of the illustrated example includes a first area 214 (e.g., an area that has opaque or non-transparent characteristic(s) and represented by a first dashed boundary line in FIG. 2) and a second area 216 (e.g., an area that has substantially transparent or translucent characteristic(s) and represented by a second dashed boundary line in FIG. 2). The second area 216 is disposed above and/or overlaps the camera 212 to allow light to pass from outside of the display (e.g., an upper or outer surface of the display 200) to the camera 212 to enable the camera 212 to record or capture an image through the display 200.

To present an image on the viewing area 202, the display 200 of the illustrated example includes a display controller 218. The display controller 218 of the illustrated example communicates or controls the pixels 206 of the pixel array 204 to present an image on the viewing area 202. The display controller 218 generates signals 220 to operate the respective ones of the pixels 206.

To communicate first signals 220a to (e.g., to activate/deactivate) the pixels 206 of the pixel array 204, the display 200 of the illustrated example includes a set of source lines 222. To communicate second signals 220b to (e.g., activate/deactivate) the pixels 206 of the pixel array 204, the display 200 of the illustrated example includes a first set of gate lines 224. To communicate third signals 220c to (e.g., activate/deactivate) the pixels 206 of the pixel array 204, the display 200 of the illustrated example includes a second set of gate lines 226. The source lines 222, the first set of gate lines 224, and the second set of gate lines 226 of the illustrated example are communicatively coupled to the display controller 218 via a source driver interface 228, a first gate driver interface 230, and a second gate driver interface 232, respectively.

The display 200, via the signals 220 from the display controller 218, can present an image by controlling the pixels 206 in the first area 214 (e.g., an opaque area) of the viewing area 202 and the second area 216 (e.g., a transparent area) of the viewing area 202. Thus, although the display 200 of the illustrated example includes the first area 214 and the second area 216, the first area 214 and the second area 216 provide a seamless viewing area when presenting an image. In other words, an image can be presented on both the first area 214 and the second area 216 without affecting (e.g., degrading a quality of) an image presented across the first area 214 and the second area 216 of the viewing area 202. Thus, an image can be presented across the viewing area 202 (e.g., the entire viewing area 202) of the display 200 including the pixels 206 corresponding to the second area 216.

The source lines 222 of the illustrated example include a first source line 234 and a second source line 236. The first set of gate lines 224 of the illustrated example include a first gate line 238 and a second gate line 240. The second set of gate lines 226 of the illustrated example include a third gate line 242 and a fourth gate line 244. Additionally, the first source line 234 of the illustrated example includes a first portion 246 composed of a first material and a second portion 248 composed of a second material different than the first material. Similarly, the first gate line 238 of the illustrated example includes a first portion 250 composed of the first material and a second portion 252 composed of the second material. Likewise, the third gate line 242 of the illustrated example includes a first portion 254 composed of the first material and a second portion 256 composed of the second material. The second source line 236, the second gate line 240, and the fourth gate line 244 of the illustrated example are composed of the first material.

The first material of the illustrated example can be an opaque or non-transparent conductor composed of a metallic material such as, for example, copper, aluminum, titanium, silver, molybdenum, composition or stacked layers of these materials, and/or any other suitable conductive material(s) having opaque characteristic(s). The second material of the illustrated example can be a transparent conductor composed of, for example, indium tin oxide (ITO), indium zinc oxide (IZO), indium gallium zinc oxide (IGZO) and/or any other conductive material(s) having transparent characteristic(s). To provide the first area 214, the first portions 246, 250, 254 of the respective first source line 234, the first gate line 238, and the third gate line 242 are composed of the first material (e.g., an opaque conductor). Additionally, to provide the first area 214, the second source line 236, the second gate line 240, and the fourth gate line 244 are composed of the first material. To provide the second area 216, the second portion 248 of the first source line 234, the second portion 252 of the first gate line 238, and the second portion 256 of the third gate line 242 of the illustrated example are composed of the second material (e.g., a transparent conductor). For example, the first portions 246, 250, 254 of the respective first source line 234, the first gate line 238, and the third gate line 242 and the second source line 236, the second gate line 240, and the fourth gate line 244 defining the first area 216 have a first resistivity characteristic or property. The second portion 248 of the first source line 234, the second portion 252 of the first gate line 238, and the second portion 256 of the third gate line 242 of the illustrated example have a second resistivity characteristic or property. The first resistivity characteristic is different than (e.g., less than) the second resistivity characteristic.

Additionally, the transparent conductive material(s) forming the second portions 248, 252, 256 of the respective first source line 234, the first gate line 238, and the third gate line 242 of the illustrated example have relatively high resistive characteristic(s). To this end, to avoid signal degradation of the signals 220 provided by the display controller 218 to the pixels 206 in the second area 216, the first set of gate lines 224 is electrically isolated from the second set of gate lines 226. To electrically isolate the first set of gate lines 224 and the second set of gate lines 226, gaps 258 (e.g., discontinuities or spaces) are provided (e.g., formed) between terminating ends 260 of the first set of gate lines 224 and terminating ends 262 of the second set of gate lines 226. To this end, the first set of gate lines 224 of the illustrated example extend between a first edge 264 (e.g., a left side edge in the orientation of FIG. 2) of the display 200 and a midsection 266 (e.g., a center) of the display 200, and the second set of gate lines 226 of the illustrated example extend between a second edge 268 (e.g., a right side edge in the orientation of FIG. 2) of the display 200 and the midsection 266. Thus, the first set of gate lines 224 are associated with the pixels 206 of a first portion 270 (e.g., a first half between the first edge 264 and the midsection 266) of the viewing area 202 of the display 200, and the second set of gate lines 226 are associated with the pixels 206 of a second portion 272 (e.g., a second half between the second edge 268 and the midsection 266) of the viewing area 202 of the display 200. Additionally, the source lines 222 extend between a third edge 274 (e.g., a bottom edge in the orientation of FIG. 2) of the display 200 and a fourth edge 276 (e.g., an upper edge in the orientation of FIG. 2) of the display 200 opposite the third edge 274. To this end, the second portion 248 of the first source line 234 defines a terminating end 278 of the first source line 234. Thus, the second portion 248 of the first source line 234 does not degrade the signals 220 from the display controller 218 given that the second portion 248 of the first source line 234 is positioned at a terminating end 278 of the first source line 234.

As a result of the gaps 258, the second portion 248 of the first source line 234, the second portion 252 of the first gate line 238, and the second portion 256 of the third gate line 242 that are formed with the transparent conductors are positioned at the terminating ends 278, 260, 262 of the respective first source line 234, the first gate line 238, and the third gate line 242. Positioning the transparent conductors at the terminating ends 278, 260, 262 of the respective first source line 234, the first gate line 238, and the third gate line 242 reduces degradation and/or interference with the signals 220 that can otherwise occur if the transparent conductors of the first gate line 238 and the third gate lines 242 are not separated by the gaps 258 (i.e., if the terminating ends 260, 262 were electrically coupled and the first gate line 238 and the third gate line 242 were formed as a unitary gate line). Further, positioning the transparent conductor of the first source line 234 at the terminating end 278 of the first source line 234 significantly reduces degradation and/or interference with the signals 220. In the illustrated example, the second area 216 of the display 200 is formed adjacent the midsection 266 and the fourth edge 276 of the display 200. To this end, the camera 212 is positioned adjacent the terminating end 278 of the first source line 234, the terminating end 260 of the first gate line 238, and the terminating end 262 of the third gate line 242. Thus, the camera 212 is disposed adjacent the second portions 248, 252, 256 of the respective first source line 234, the first gate line 238, and third gate line 242.

To generate or present an image on the display 200 or to control an image presented on the display 200, the source lines 222 and the first set of gate lines 224 activate or deactivate the pixels 206 of the first portion 270 of the viewing area 202, and the source lines 222 and the second set of gate lines 226 activate or deactivate the pixels 206 of the second portion 272 of the viewing area 202. For example, the display controller 218 communicates a first signal 220a1 to a first pixel 206a of the first portion 270 via a first source line 222a and a second signal 220b1 to a first one 224a of the first set of gate lines 224 to control a gate of the first pixel 206a (e.g., a pixel RGB). Likewise, the display controller 218 communicates a third signal 220a2 to a second pixel 206b of the second portion 272 via a second source line 222b and a fourth signal 220c1 to a first one 226b of the second set of gate lines 226 to control a gate of the second pixel 206b (e.g., a pixel RGB).

In some examples, the first source line 234, the first gate line 238, and the third gate line 242 are illustrated having the respective first portions 246, 250, 254 and the respective second portions 248, 252, 256 for simplicity and/or discussion purposes. However, the display 200 of the illustrated example may be implemented with a plurality of the first source lines constructed identical to the first source line 234, a plurality of the first gate lines constructed identical to the first gate line 238, and a plurality of the third gate lines constructed identical to the third gate line 242 to implement or define the second area 216 of the display 200. For example, the display 200 of the illustrated example can include hundreds or thousands of first source lines 234, hundreds or thousands of first gate lines 238, and/or hundreds or thousands of third gate lines 242.

Figure 3:
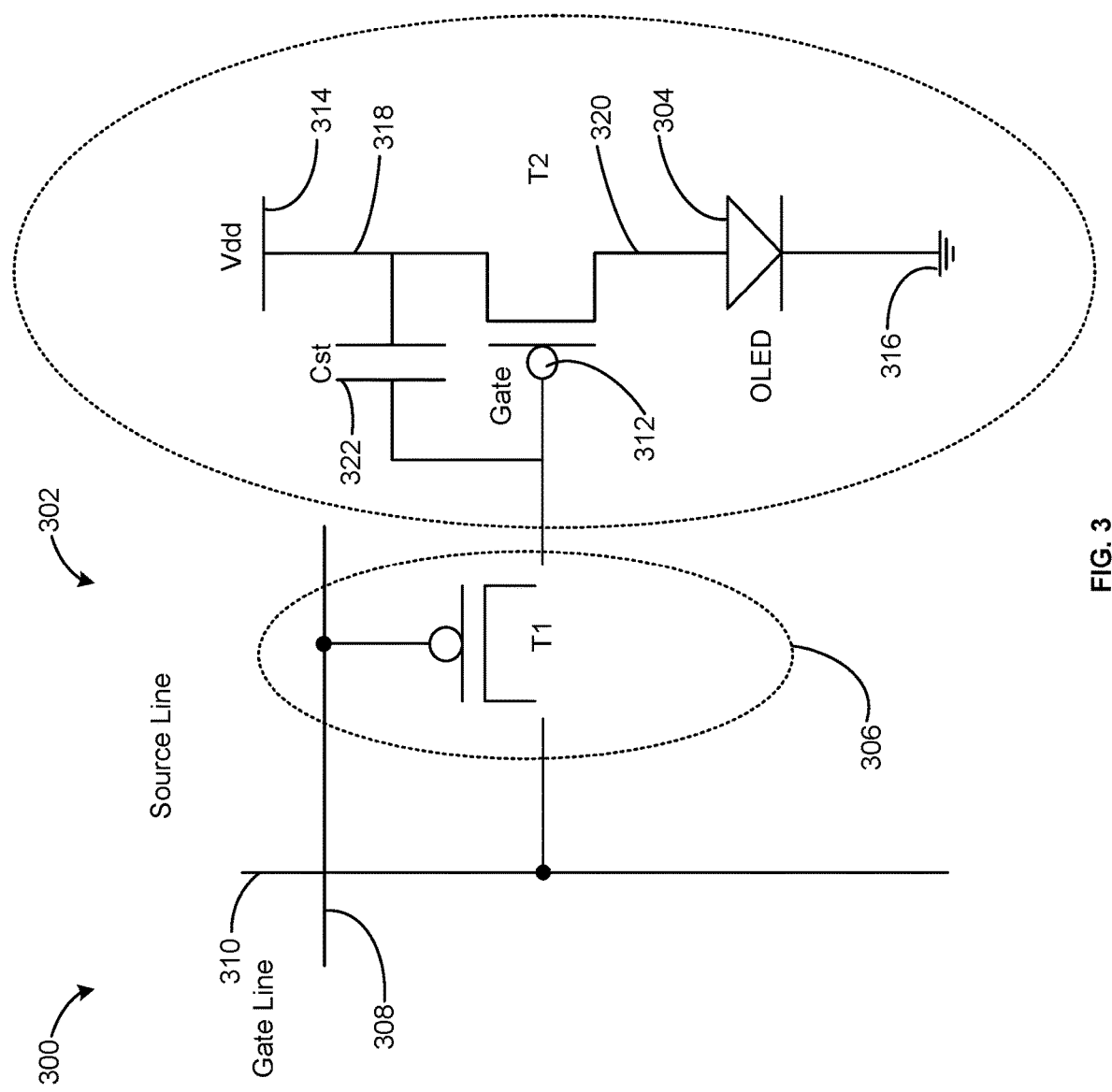
FIG. 3 illustrates an example circuit for controlling an example pixel of the example display of FIG. 2.

FIG. 3 is a schematic diagram of an example pixel 300 of the pixel array of FIG. 2. The pixel 300 of the illustrated example can implement the pixels 206 of FIG. 2. By way of example, the pixel 300 of the illustrated example is an OLED sub-pixel. A circuit 302 activates and/or deactivates the pixel 300. The circuit 302 is defined by a first transistor (T1) (e.g., a first thin-film transistor) that activates an OLED 304 defined by a second transistor (T2) (e.g., a second thin-film transistor). To activate the pixel 300, the circuit 302 includes a switch 306 defined by the first transistor T1 (e.g., a thin-film transistor or semiconductor). The switch 306 is operated (e.g., activated or deactivated) by a gate line 308 and a source line 310. The gate line 308 of the illustrated example implements a respective one of the first set of gate lines 224 of FIG. 2 and/or a respective one of the second set of gate lines 226 of FIG. 2. The source line 310 of the illustrated example implements a respective one of the source lines 222 of FIG. 2. The switch 306 controls communication of the signals 220 from the source line 310 to a gate 312 of the transistor T2. The transistor T2 and the OLED 304 are connected in series between a positive power supply terminal 314 and a ground power supply terminal 316. A source 318 of the transistor T2 is coupled to the positive power supply terminal 314, and a drain 320 of the transistor T2 is coupled to the OLED 304 (e.g., at the anode terminal of the OLED). The OLED 304 (e.g., a cathode terminal of the OLED) is coupled to the ground power supply terminal 316. When energized, the gate 312 of the illustrated example generates an electric field (e.g., to create a channel) to cause electrons to flow between the drain 320 and the source 318. Based on the signals 220 provided to the source line 310 by the display controller 218 (FIG. 2), the amount of current flowing between the drain 320 and the source 318 is controlled by a voltage (V) applied between the gate 312 and the source 318 relative to a voltage (V) applied between the drain 320 and the source 318. During operation, the switch 306 is turned on by the gate line 308. The transistor T2 applies current to the OLED 304 based on the signals 220 (e.g., a voltage signal) from the source line 310. The voltage that is applied to the gate 312 of the transistor T2 by the source line 310 via the switch 306 controls a magnitude of a current to the OLED 304, which controls a light intensity of the OLED 304 (e.g., a pixel). A storage capacitor (Cs) 322 can be used to store data on the pixel 300 between successive frames. The example circuit 302 of FIG. 3 is merely illustrative. In some examples, the pixel 300 can be implemented by another circuitry and/or can include any number of transistors (e.g., four transistors, ten transistors, etc.).

Figure 4:
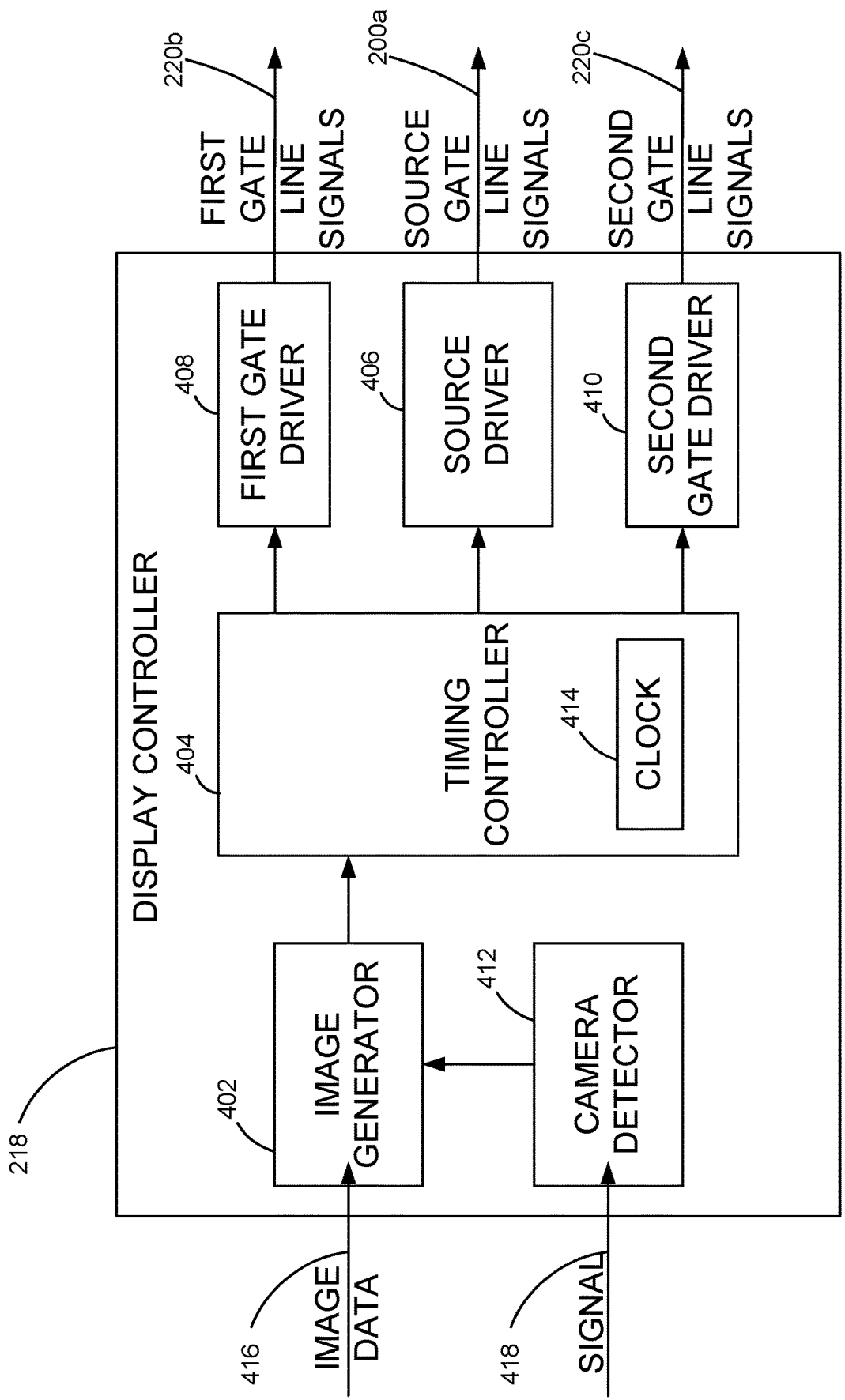
FIG. 4 is a block diagram of an example display controller for controlling the example display of FIG. 2.

FIG. 4 is a block diagram of an example display controller 218 of FIG. 2. The example display controller 218 of the illustrated example includes an example image generator 402, an example timing controller 404, an example source driver 406, an example first gate driver 408, an example second gate driver 410, and a camera detector 412. The timing controller 404 of the illustrated example includes an example clock 414. In some examples, the example image generator 402, the example timing controller 404, the example source driver 406, the example first gate driver 408, and the example second gate driver 410 are in communication (e.g., via a communication bus, by writing and reading data from a memory, etc.).

The image generator 402 of the illustrated example provides the display 200 with content that is to be displayed on the viewing area 202. The content may include still image content and/or moving image content such as, for example, video content for a movie, moving graphics, or other moving image content representative by image data 416. The image data 416 to be processed by the display 200 can be conveyed or transferred to the display controller 218 over a data path (e.g., a flexible circuit cables, input/output interface (e.g., an HDMI interface, a USB interface, etc.)). The image generator 402 converts the image data 416 to corresponding data signals to be provided to the pixels 206 of the pixel array 204. In some examples, the image generator 402 can convert digital signals from the image data 416 to analog signals for the first gate driver 408, the second gate driver 410, and/or the source driver 406. For example, the image generator 402 converts the image data 416 to the signals 220 (e.g., voltage signals (Vdata)) for respective ones of the source lines 222, the first set of gate lines 224, and the second set of gate lines 226. Thus, in some examples, the image generator 402 can include an analog-to-digital converter and/or other components or converters to convert the image data 416.

To control activation of the pixels 206 of the pixel array 204, the display controller 218 of the illustrated example includes the source driver 406, the first gate driver 408, and the second gate driver 410. The source driver 406 of the illustrated example provides the first signals 220a (e.g., voltage signals, current signals, etc.) from the image generator 402 to the source lines 222. The first gate driver 408 of the illustrated example provides the second signals 220b (e.g., voltage signals, current signals, etc.) from the image generator 402 to the first set of gate lines 224. The second gate driver 410 of the illustrated example provides the third signals 220c (e.g., voltage signals, current signals, etc.) from the image generator 402 to the second set of gate lines 226.

For example, for a particular image, the image generator 402 and/or the source driver 406 of the illustrated example determines which pixels 206 of the pixel array 204 require activation to generate the image and distributes the first signals 220a to the pixels 206 via the source lines 222. Additionally, the image generator 402 and/or the first gate driver 408 determines which pixels 206 of the pixel array 204 require activation and provides the second signals 220b (e.g., voltage signals, current signals, etc.) to the pixels 206 associated with the first set of gate lines 224. Likewise, the image generator 402 and/or the second gate driver 410 determines which pixels 206 of the pixel array 204 require activation and provides the third signals 220c (e.g., voltage signals, current signals, etc.) to the pixels 206 associated with the second set of gate lines 226.

To control or coordinate timing of first signals 220a from the source driver 406 to respective ones of the source lines 222, the second signals 220b from the first gate driver 408 to respective ones of the first set of gate lines 224, and the third signals 220c from the second gate driver 410 to respective ones of the second set of gate lines 226, the display 200 of the illustrated example includes the timing controller 404. The timing controller 404 includes the clock 414 to enable proper timing and/or activation of the pixels 206 of the pixel array 204 to generate an image on the viewing area 202.

The camera detector 412 determines when the camera 212 is in use. To determine when the camera 212 is in use, the camera detector 412 receives a signal 418. The signal 418 may be provided by a camera application of an electronic device (e.g., the electronic devices 100a-e) representative of the camera application being in an active condition (e.g., a non-sleep mode or an in use mode). The camera detector 412 communicates a status of the camera 212 to the image generator 402. When the camera detector 412 detects that the camera 212 is in use, the image generator 402 provides one or more commands to the source driver 406, the first gate driver 408, and/or the second gate driver 410 to deactivate the pixels 206 that overlap the camera 212 and/or define the second area 216 of the viewing area 202 of the display 200. In this manner, an image being presented across the second area 216 can be removed when the camera 212 is in use so that the presented image does not interfere with the operation of the camera 212.

While an example manner of implementing the display controller 218 of FIG. 2 is illustrated in FIG. 4, one or more of the elements, processes, and/or devices illustrated in FIG. 4 may be combined, divided, re-arranged, omitted, eliminated, and/or implemented in any other way. Further, the example image generator 402, the example timing controller 404, the example source driver 406, the example first gate driver 408, the example second gate driver 410, the camera detector 412, the clock 414, and/or, more generally, the example display controller 218 of FIG. 4 may be implemented by hardware, machine readable instructions, or a combination thereof. Thus, for example, any of the example image generator 402, the example timing controller 404, the example source driver 406, the example first gate driver 408, the example second gate driver 410, the camera detector 412, the clock 414, and/or, more generally, the example display controller 218 of FIG. 4 may be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). Further still, the example display controller 218 of FIG. 4 may include one or more elements, processes, and/or devices in addition to, or instead of, those illustrated in FIG. 4, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

FIG. 5 is a cross-sectional view of the example first gate line 238 of the display 200 of FIG. 2. The first gate line 238 is positioned above (e.g., supported by) a substrate 502. In some examples, the substrate 502 can also support the pixels 206 of the pixel array 204. Specifically, the first portion 250 and the second portion 252 of the first gate line 238 are positioned (e.g., deposited) on the substrate 502. A first insulator layer 504 is formed on the first gate line 238. A second insulator layer 506 is positioned on the first insulator layer 504, and a third insulator layer 508 is positioned on the second insulator layer 506. The first portion 250 of the first gate line 238 is electrically coupled to the second portion 252 of the first gate line 238 via a first connector 510. The first connector 510 of the illustrated example is composed of a conductive material (e.g., a metallic material such as copper, aluminum, titanium, silver, molybdenum, composition or stacked layers of these materials, etc.). The first connector 510 of the illustrated example is positioned above the first gate line 238. Specifically, the first connector 510 of the illustrated example is positioned above (e.g., supported by) by the first insulator layer 504. To electrically couple the first connector 510 and the first gate line 238, a first via 512 (e.g., an opening) is formed in the first insulator layer 504 to provide access to the first portion 250 of the first gate line 238 and a second via 514 (e.g., an opening) is formed in the first insulator layer 504 to provide access to the second portion 252 of the first gate line 238. The first and second vias 512, 514 are filed with conductive material (e.g., metallic material) that form respective first and second contacts 516, 518 to electrically couple the first connector 510 and the respective first and second portions 250, 252 of the first gate line 238. The third gate line 242 is formed identical to the first gate line 238 and is not discussed herein for brevity. To further reduce signal degradation between the first and second portions 250, 252, a gap 520 is formed between the first portion 250 and the second portion 252.

FIG. 6 is a cross-sectional view of the first source line 234 of the display 200 of FIG. 2. By way of example, the source lines 222 are offset (e.g., offset in a vertical direction in the orientation of FIGS. 6 and 7) relative to the first and second sets of gate lines 224, 226. In other words, the source lines 222 do not intersect the first and second sets of gate lines 224, 226. For example, one or more of the insulator layers 504, 506, 508 are positioned between the source lines 222 and the first and second sets of gate lines 224, 226. In the illustrated example, the first and second sets of gate lines 224, 226 are positioned on (e.g., supported on) the substrate 502, and the source lines 222 are positioned on (e.g., supported by) the first insulator layer 504. As shown in the illustrated example, the first portion 246 and the second portion 248 of the first source line 234 are positioned (e.g., deposited) on the first insulator layer 504. The first portion 246 of the first source line 234 is electrically coupled to the second portion 248 of the first source line 234 via a second connector 602. The second connector 602 of the illustrated example is composed of a conductive material (e.g., a metallic material such as copper, aluminum, titanium, silver, molybdenum, composition or stacked layers of these materials, etc.). The second connector 602 of the illustrated example is positioned above the first source line 234. Specifically, the second connector 602 of the illustrated example is positioned above (e.g., supported by) by the second insulator layer 506. To electrically couple the second connector 602 and the first and second portions 246, 248 of the first source line 234, a first via 604 (e.g., an opening) is formed in the second insulator layer 506 to provide access to the first portion 246 of the first source line 234, and a second via 606 (e.g., an opening) is formed in the second insulator layer 506 to provide access to the second portion 248 of the first gate line 238. The first and second vias 604, 606 are filed with conductive material (e.g., metallic material) to form first and second contacts 608, 610 to electrically couple the second connector 602 and the first and second portions 246, 248 of the first source line 234, respectively. To further reduce signal degradation between the first portion 246 and the second portion 248, a gap 612 is formed between the first portion 246 and the second portion 248.

FIG. 7 is a cross-sectional view of another example connector 700 to couple the first and second portions 250, 252 of the first gate line 238. The connector 700 of the illustrated example is positioned on (e.g., supported by the second insulator layer 506. To electrically couple the connector 700 and the first and second portions 250, 252 of the first gate line 238, a first via 702 (e.g., an opening) is formed through the first and second insulator layers 504, 506 to access the first portion 250 of the first gate line 238, and a second via 704 (e.g., an opening) is formed through the first and second insulator layers 504, 506 to access the second portion 252 of the first gate line 238. The first and second vias 702, 704 are filled with conductive material to form respective contacts 706, 708 that electrically couple the connector 700 and the first and second portions 250, 252 of the first gate line 238.

FIG. 8 is a cross-sectional view of another example connector 800 to couple the first and second portions 250, 252 of the first gate line 238. In the illustrated example, the connector 800 is positioned on (e.g., in direct contact with) the first portion 250 of the first gate line 238 and the second portion 252 of the first gate line 238. For example, the connector 800 includes a first portion 802 overlapping or in direct contact with the first portion 250 of the first gate line 238 and a second portion 804 overlapping or in direct contact with the second portion 252 of the first gate line 238. The connector 800 of the illustrated example is composed of a conductive material having transparent characteristic(s). For example, the connector 800 of the illustrated example is formed from the same material as the second portion 252 of the first gate line 238. In some examples, the connector 800 can be formed of a conductive material such as, for example a transparent conductive material (e.g., ITO, IZO, IGZO, etc.).

Figure 9:
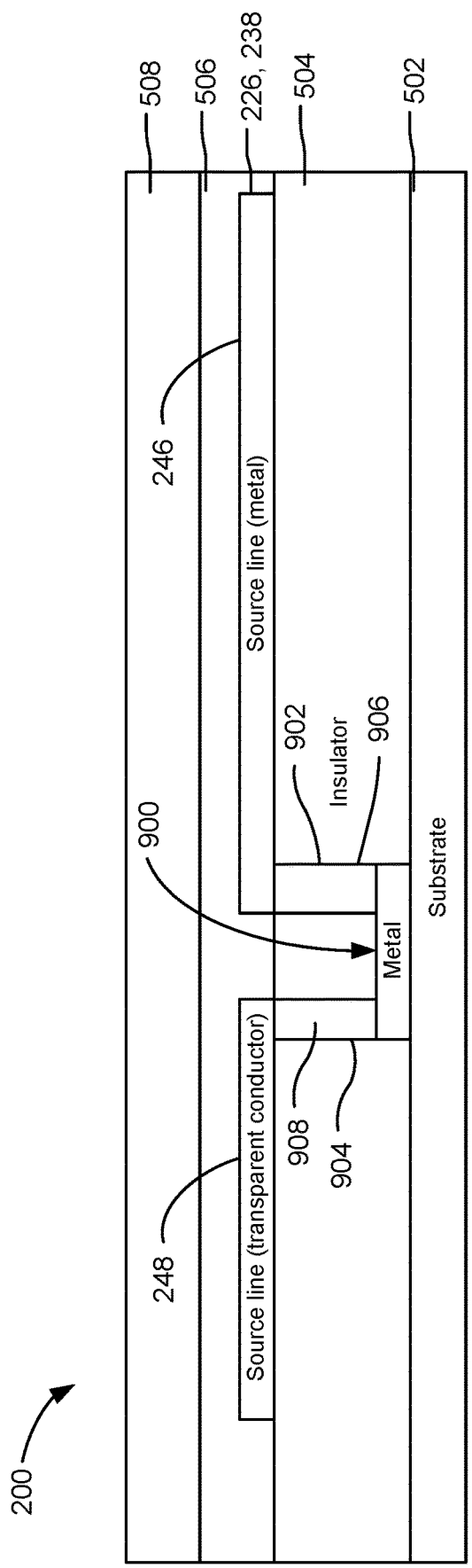
FIG. 9 is a partial cross-sectional view of an example connector that can implement the example first source line of FIG. 6.

FIG. 9 is a cross-sectional view of another example connector 900 to electrically couple the first and second portions 246, 248 of the first source line 234. The connector 900 of the illustrated example is positioned on (e.g., supported by) the substrate 502. To electrically couple the connector 900 and the first and second portions 246, 248 of the first source line 234, a first via 902 (e.g., an opening) is formed through the first insulator layer 504 to access the first portion 246 of the first source line 234, and a second via 904 (e.g., an opening) is formed through the first insulator layer 504 to access the second portion 248 of the first source line 234. The first via 902 is filled with a first conductive material (e.g., a metal) to form a first contact 906 to couple the connector 900 and the first portion 246 of the first source line 234. The second via 904 is filled with a second conductive material (e.g., a conductive transparent material) different than the first conductive material to form a second contact 908 to couple the connector 900 and the second portion 248 of the first source line 234. For example, the first conductive material can be metal material (e.g., copper, aluminum, etc.) and the second conductive material can be a transparent material (e.g., ITO, IZO, IGZO, etc.). After the first and second vias 902, 904 are filled with the respective first and second materials, the first source line 234 is formed on the first insulator layer 504. The second and third insulator layers 506, 508 are formed after formation of the first source line 234.

Figure 10:
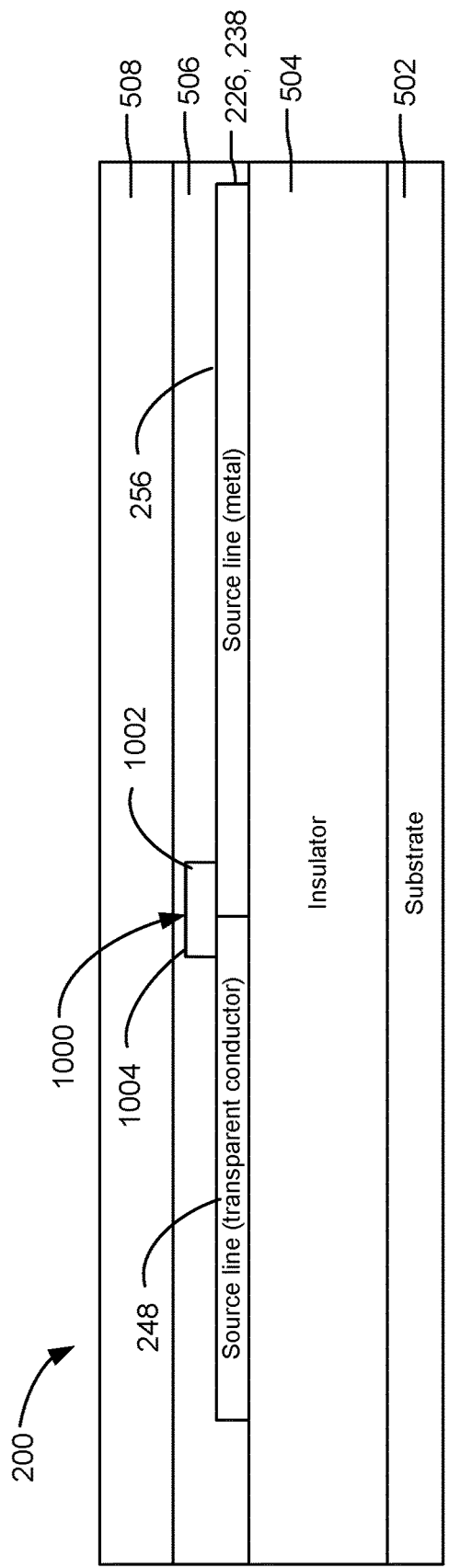
FIG. 10 is a partial cross-sectional view of another example connector that can implement the example source line of FIG. 6.

FIG. 10 is a cross-sectional view of another example connector 1000 to couple the first and second portions 246, 248 of the first source line 234. In the illustrated example, the connector 1000 is positioned on (e.g., in direct contact with) the first portion 246 and the second portion 248 of the first source line 234. For example, the connector 1000 includes a first portion 1002 overlapping or in direct contact with the first portion 246 of the first source line 234, and a second portion 1004 overlapping or in direct contact with the second portion 248 of the first source line 234. The connector 1000 of the illustrated example is composed of a conductive, transparent material. For example, the connector 1000 of the illustrated example is formed from the same material as the second portion 248 of the first source line 234. In some examples, the connector 1000 can be formed of a transparent conductive material (e.g., ITO, IZO, IGZO, etc.).

Figure 11A:
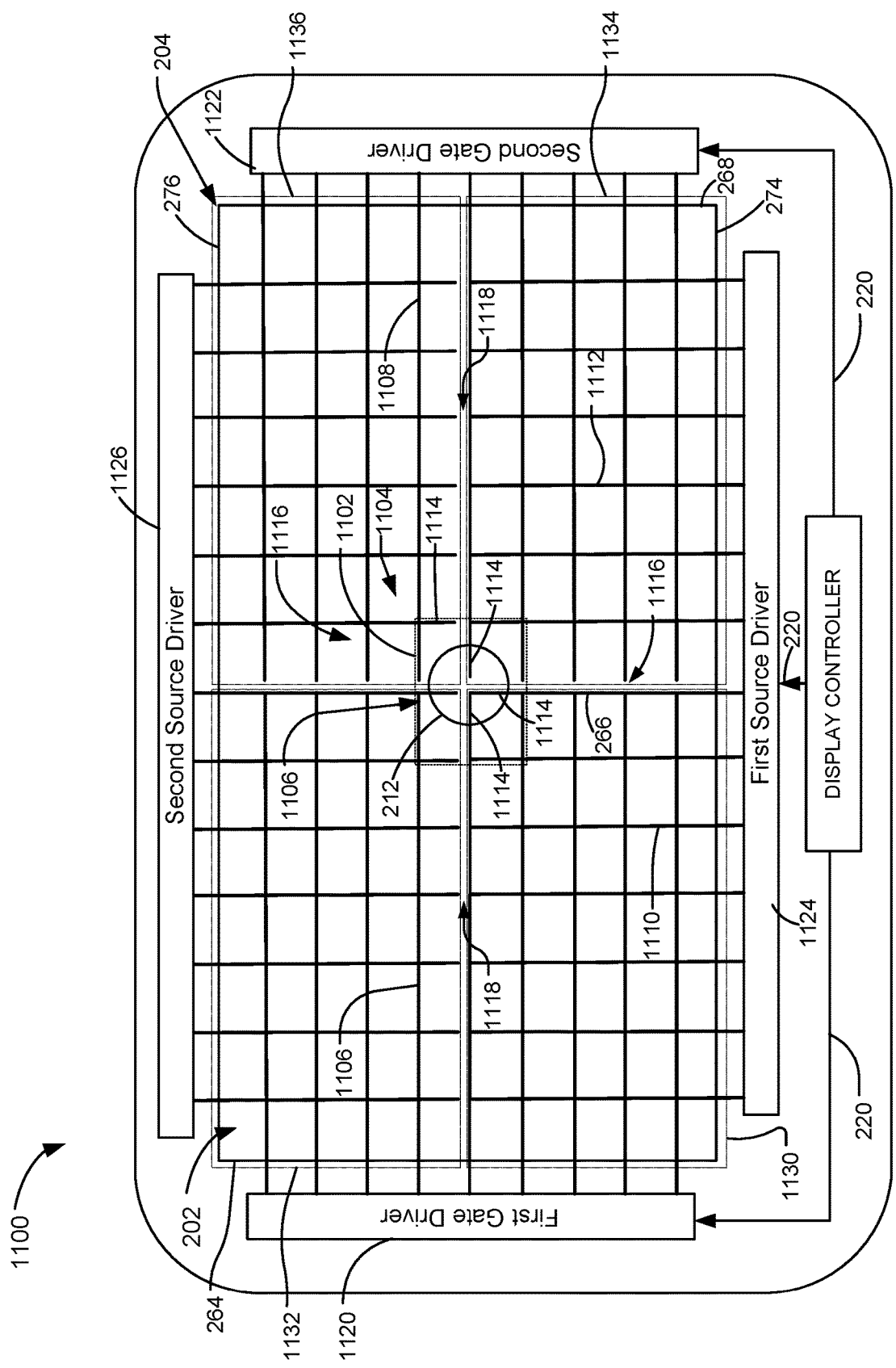
FIG. 11A is a block diagram of another example display disclosed herein.

FIG. 11A illustrates another example display 1100 disclosed herein. Many of the components of the example display 1100 of FIG. 11 are substantially similar or identical to the components disclosed above in connection with FIGS. 2-10. As such, those components will not be described in detail again. Instead, the interested reader is referred to the above corresponding disclosures for a complete written description of the structure and operation of such components. To facilitate this process, similar or identical reference numbers will be used for like structures in FIG.11 as used in FIGS. 2-10.

The location of the camera 212 is not limited to being positioned adjacent an edge (e.g., the fourth edge 276) of the display 1100. For example, the camera 212 may be positioned at any suitable location of a viewing area 202 of the display 1100. In the illustrated example of FIG. 11A, the display 1100 includes a transparent area 1102 formed at a central location 1104 of the viewing area 202 of the display 1100. For example, the central location 1104 can be located at the midsection 266 of the viewing area 202 between the first edge 264, the second edge 268, the third edge 274, and fourth edge 276 of the display 1100. The display 1100 of the illustrated example includes a first set of gate lines 1106, a second set of gate lines 1108, a first set of source lines 1110, and a second set of source lines 1112. Specifically, one or more of the first and second sets of gate lines 1106, 1108 and one or more of the first and second sets of source lines 1110, 1112 include transparent portions 1114. To avoid degradation of the signals 220 across transparent portions 1114 of the first set of gate lines 1106 and the second set of gate lines 1108, gaps 1116 are formed between terminating ends of the respective first set of gate lines 1106 and the second set of gate lines 1108. Likewise, to avoid degradation of the signals 220 across transparent portions 1114 of the first set of source lines 1110 and the second set of source lines 1112, gaps 1118 are formed between respective terminating ends of the first set of source lines 1110 and the second set of source lines 1112. As a result, the display controller 218 of the illustrated example controls the pixel array 204 in multiple portions (e.g., quadrants). The display controller 218 includes a first gate driver 1120 to drive the first set of gate lines 1106, a second gate driver 1122 to drive the second set of gate lines 1108, a first source driver 1124 to drive the first set of source lines 1110, and a second source driver 1126 to drive the second set of source lines 1112. For example, the first gate driver 1120 and the first source driver 1124 operate the pixels 206 of a first quadrant 1130 of the pixel array 204. The first gate driver 1120 and the second source driver 1126 operate the pixels 206 in a second quadrant 1132 of the pixel array 204. The first source driver 1124 and the second gate driver 1122 operate pixels 206 in a third quadrant 1134 of the pixel array 204. The second source driver 1126 and the second gate driver 1122 operate pixels 206 in a fourth quadrant 1136 of the pixel array 204. The viewing area 202 outside of the transparent area 1102 of the illustrated example is opaque.

Figure 11B:
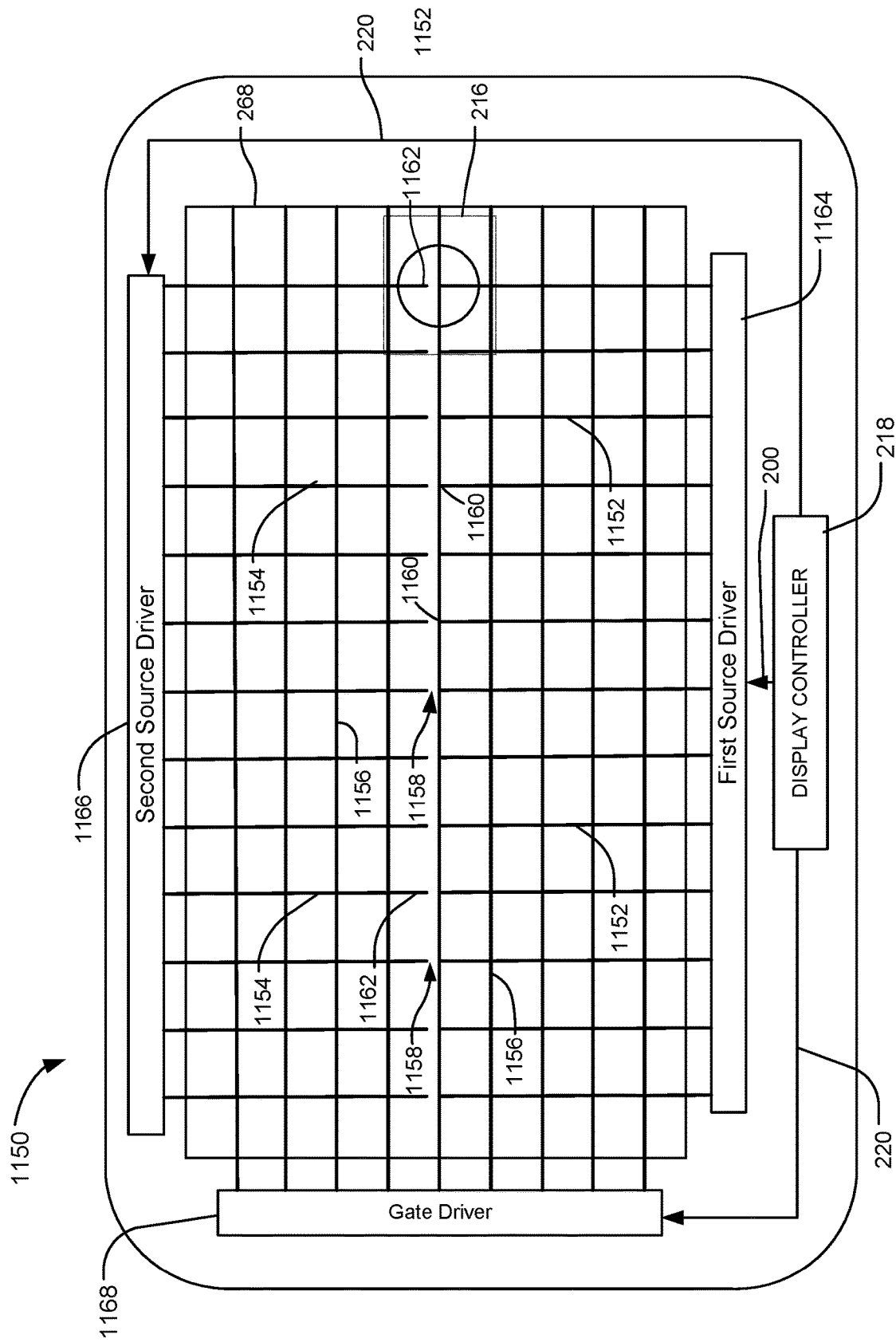
FIG. 11B is a block diagram of another example display disclosed herein.

Referring to FIG. 11B, the camera 212 and/or the second area 216 are positioned adjacent the second edge 268 of the display 1150. In the illustrated example, the display 1150 includes a first set of source lines 1152, a second set of source lines 1154, and a plurality of gate lines 1156. The first set of source lines 1152 are electrically isolated from the second set of source lines 1154 via gaps 1158 formed between ends 1160 of the first set of source lines 1152 and ends 1162 of the second set of source lines 1154. The gate lines 1156 extend between first edge 264 and the second edge 268 of the display 1150. A first source driver 1164 of the display controller 218 provides signals 220 to the first set of source lines 1152, a second source driver 1166 provides signals 220 to the second set of source lines 1154, and a gate driver 1168 provides signals 220 to the gate lines 1156.

Figure 12:
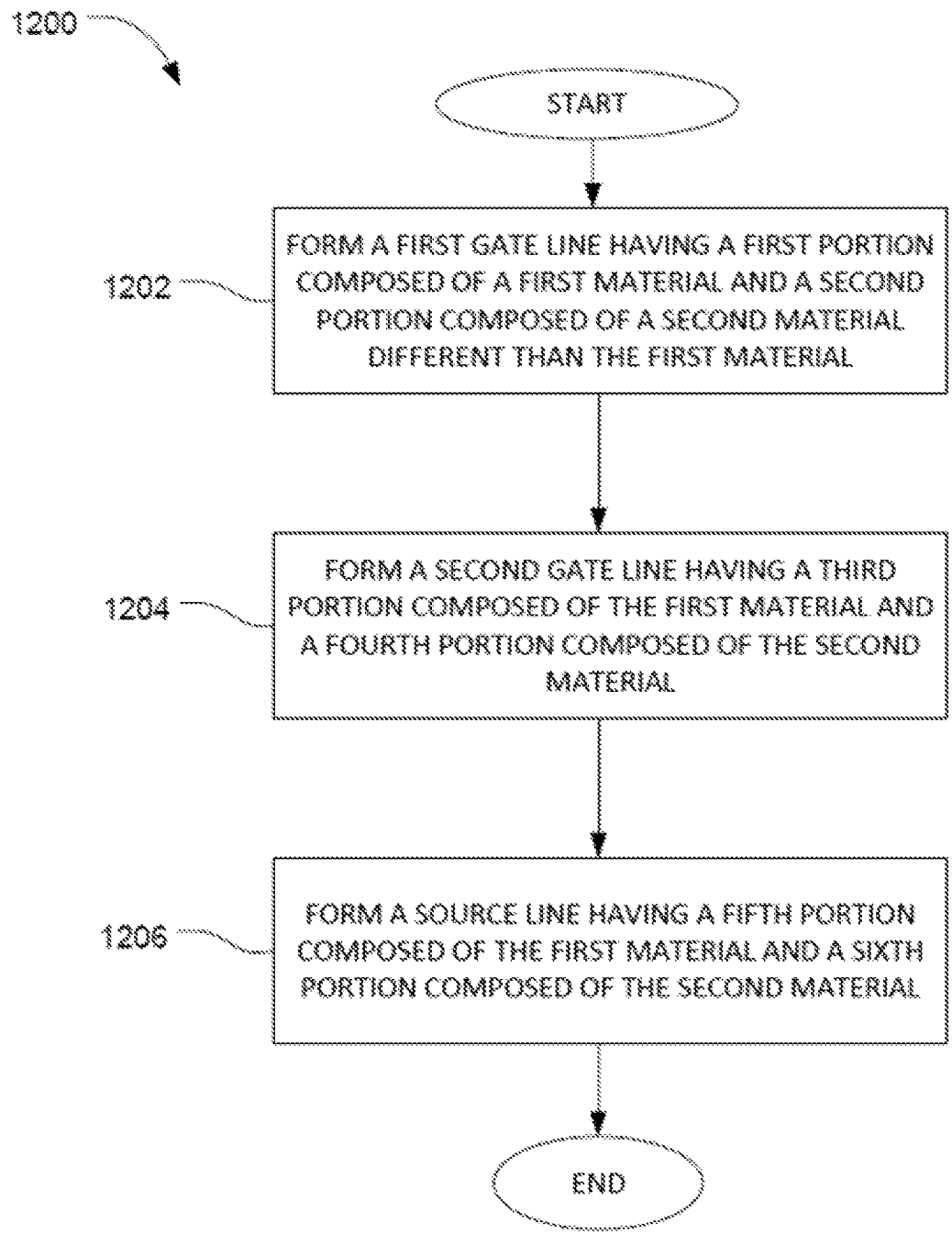
FIG. 12 is a flowchart illustrating an example method of manufacturing an example display disclosed herein.

FIG. 12 is a flowchart of an example method or process of fabricating an example display disclosed herein. For example, the method 1200 of FIG. 12 can be used to fabricate or form the example displays 102a-d, 200, 1100, 1150 of FIGS. 1A-1D, 2-10, 11A, and 11B. Example displays (e.g., the displays 102a-e, 200, 1100, 1150) disclosed herein can be implemented with semiconductor or microfabrication (MEMS) manufacturing processes or technique(s). Some example processes include activities such as wafer handling, wafer sawing, die pick and place, die attach, ultrasonic wire bonding activities, and/or package molding activities. For example, microfabrication, as described herein, relates to the process used for manufacture of nanometer and/or micrometer sized features on a variety of substrates using conventional microfabrication techniques. The process of microfabrication described herein may include a process or a combination of processes such as, for example, photolithography, thermal inkjet manufacturing techniques, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, additive manufacturing (e.g., 3-D printing), laminating, and/or any other processes commonly used for manufacture of MEMS (microelectromechanical systems) or semiconductor devices.

While an example manner of forming the example display 200 has been illustrated in FIG. 12, one of the steps and/or processes illustrated in FIG. 12 may be combined, divided, re-arranged, omitted, eliminated, and/or implemented in any other way. Further still, the example method of FIG. 12 may include processes and/or steps in addition to, or instead of, those illustrated in FIG. 12 and/or may include more than one of any or all of the illustrated processes and/or steps. Further, although the example methods are disclosed with reference to the flowchart illustrated in FIG. 12, many other methods or processes of forming electronic packages may alternatively be used.

To facilitate discussion of the example method 1200, the example method 1200 will be described in connection with the display 200 of FIGS. 2-6 and, more specifically, with the cross-sectional views of FIGS. 5 and 6.

Referring to the example method 1200 of FIG.12, the method 1200 begins by forming a first gate line 238 having a first portion 250 composed of a first material and a second portion 252 composed of a second material different than the first material (block 1202). Specifically, the first set of gate lines 224 including at least the first gate line 238 and the second gate line 240 are formed on the substrate 502. For example, the first gate line 238 is formed on the substrate 502. The substrate 502 may be obtained or formed via semiconductor or MEMS manufacturing processes or technique(s). The substrate 502 of the illustrated example may be silicon wafer or other structure composed of, for example, silicon (Si), gallium arsenide, germanium, quartz, etc. To form the first gate line 238, a first layer of the first material (e.g., a metallic material) defining the first portion 250 can be deposited on a first area of the substrate 502 and a second layer of the second material (e.g., the transparent conductor) defining the second portion 256 can be deposited on a second area of the substrate 502. The first material can be, for example, copper, aluminum, titanium, and/or any other opaque conductive material, and the second material can be, for example, indium tin oxide (ITO), indium zinc oxide (IZO), indium gallium zinc oxide (IGZO), and/or any other transparent conductive material(s).

The first and second portions 250, 252 of the first gate line 238 may be formed or patterned via etching or any other manufacturing processes. For example, to provide a pattern for etching, a photoresist layer may be applied on the substrate 502 and/or the first material corresponding to the first portion 250 of the first gate line 238 and the second material corresponding to the second portion 252 of the first gate line 238. The photoresist layer may be applied to the substrate 502 via, for example, spin coating, electroplating, spray coating, a laminated dry-film process or patterned plated, etc. The photoresist layer may be any material sensitive to ultra-violet light (wavelengths in the ultraviolet spectrum or shorter (<400 nm)). In some examples, photoresist layer is a photo-patternable polymer. Thus, the photoresist layer representative of a dimensional characteristic(s) of the first and second portions 250, 252 of the first gate line 238 is masked prior to etching the first gate line 238. After the first gate line 238 is formed (e.g., etched), the photoresist layer covering the first gate line 238 is removed (e.g., stripped via a wafer cleaning procedure (e.g., a resist stripping procedure)).

To avoid a short (e.g., a short circuit) between the first and second sets of gate lines 224, 226 (e.g., the first gate line 238) and the source lines 222 (e.g., the first source line 234), the display 200 of the illustrated example includes the first insulator layer 504 (e.g., a spacer). The first insulator layer 504 of the illustrated example is an electric insulator. For example, the first insulator layer 504 is a first planarization layer that may be an oxide. After formation of the first set of gate lines 226 (e.g., the first gate line 238), the first insulator layer 504 is positioned, deposited or otherwise formed on the substrate 502 and the first gate line 238 via, for example spin-on coating or any other manufacturing technique(s).

To electrically couple the first portion 250 of the first gate line 238 and the second portion 252 of the first gate line 238, the first via 512 is then formed in the first insulator layer 504 to access the first portion 250 of the first gate line 238 and the second via 514 is formed in the first insulator layer 504 to access the second portion 252 of the first gate line 238. For example, the first and second vias 512, 514 are formed via photolithography. A pattern may be provided via a mask or photoresist and the first and second vias 512, 514 may be formed via etching. After formation of the first and second vias 512, 514, the first and second vias 512, 514 are filled with the conductive material (e.g., aluminum, copper, ITO, IZO, etc.) to form the respective first and second contacts 516, 518.

After the first and second vias 512, 514 are filed, the first connector 510 is formed on (e.g., supported by) the first insulator layer 504. For example, the first connector 510 may be formed on the first insulator layer 504 via photolithography, etching, and/or any other manufacturing technique.

A second gate line (e.g., the third gate line 242) is formed having the first portion 254 (e.g., a third portion) composed of the first material and a second portion 256 (e.g., a fourth portion) formed of the second material (block 1204). Specifically, the second set of gate lines 226 including at least the third gate line 242 and the fourth gate line 244 are formed on the substrate 502 concurrently or simultaneously with the formation of the first set of gate lines 224. The second set of gate lines 226 is formed substantially similar to the first set of gate lines 224. Additionally, the terminating ends 260 of the first set of gate lines 224 and the terminating ends 262 of the second set of gate lines 226 are spaced by the gaps 258 to electrically isolate the first set of gate lines 224 and the second set of gate lines 226.

The first source line 234 is formed having a first portion 246 (e.g. a fifth portion) composed of the first material and a second portion 248 (e.g. a sixth portion) composed of a second material (block 1206). For example, the plurality of source lines 222 including at least the first source line 234 and the second source line 236 are formed on (e.g., supported by) the first insulator layer 504. The first and second portions 246, 248 of the first source line 234 can be formed or patterned via photolithography, etching and/or any other manufacturing processes. Additionally, because the first connector 510 of the first gate line 238 is positioned in a same planarization layer as the first source line 234 (e.g., the second insulator layer 506), the first source line 234 and the first connector 510 may be formed concurrently or simultaneously. To provide a pattern for etching, a photoresist layer may be applied on the first insulator layer 504 and/or the first material corresponding to the first portion 246 of the first source line 234 and the second material corresponding to the second portion 248 of the first source line 234. The photoresist layer may be applied to the first insulator layer 504 via, for example, spin coating, electroplating, spray coating, a laminated dry-film process or patterned plated, etc. In some examples, photoresist layer is a photo-patternable polymer. Thus, the photoresist layer representative of a dimensional characteristic(s) of the first and second portions 246, 248 of the first source line 234 is masked prior to etching the first source line 234. After the first source line 234 is formed (e.g., etched), the photoresist layer covering the first source line 234 is removed (e.g., stripped via a wafer cleaning procedure (e.g., a resist stripping procedure)).

To avoid a short (e.g., a short circuit) between the source lines 222 (e.g., the first source line 234) and other electronic components of the pixel array 204, the display 200 of the illustrated example includes the second insulator layer 506 (e.g., a spacer). The second insulator layer 506 of the illustrated example is an electric insulator. For example, the second insulator layer 506 is a second planarization layer that may be an oxide. As shown in the example of FIGS. 5 and 6, the second insulator layer 506 is positioned, deposited or otherwise formed on the first insulator layer 504 after formation of the first source line 234 via, for example spin-on coating or any other manufacturing technique(s).

To electrically couple the first portion 246 of the first source line 234 and the second portion 248 of the first source line 234, the first via 604 is formed in the second insulator layer 506 to access the first portion 246 of the first source line 234 and the second via 606 is formed in the second insulator layer 506 to access the second portion 248 of the first source line 234. For example, the first and second vias 604, 606 can be formed via photolithography. A pattern may be provided via a mask or photoresist and the first and second vias 604, 606 may be formed via etching. After formation of the first and second vias 604, 606, the first and second vias 604, 606 are filled with the conductive material (e.g., aluminum, copper, ITO, IZO, etc.) to form the respective first and second contacts 608, 610.

After the first and second vias 604, 606 are filed to form the first and second contacts 608, 610, the second connector 602 is formed above (e.g., supported by) the second insulator layer 506. For example, the second connector 602 may be formed on the second insulator layer 506 via photolithography, etching, and/or any other manufacturing technique. The second connector 602 of the illustrated example is a metallic material. After formation of the second connector 602, the third insulator layer 508 is formed above (e.g., supported by) the second insulator layer 506 via, for example spin-on coating or any other manufacturing technique(s). The third insulator layer 508 electrically insolates the second connector 602.

In some examples, the flowchart of FIG. 12 and/or the example process of FIG. 12 may be representative of example machine readable instructions for implementing a semiconductor manufacturing apparatus (e.g., equipment). In this example, the machine readable instructions include a program for execution by a processor (e.g., a processor similar to a processor 1312 shown in the example processor platform 1300 of FIG. 13). The program may be stored on a non-transitory computer readable storage medium such as a CD-ROM, a floppy disk, a hard drive, a digital versatile disk (DVD), a Blu-ray disk, or a memory associated with the processor, but the entire program and/or parts thereof could alternatively be executed by a device other than the processor and/or embodied in dedicated hardware. Further, although the example program is described with reference to the flowchart illustrated in FIG. 12, many other methods of implementing an example semiconductor manufacturing apparatus may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation.

As mentioned above, the example processes of FIG. 12 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory, and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

Figure 13:
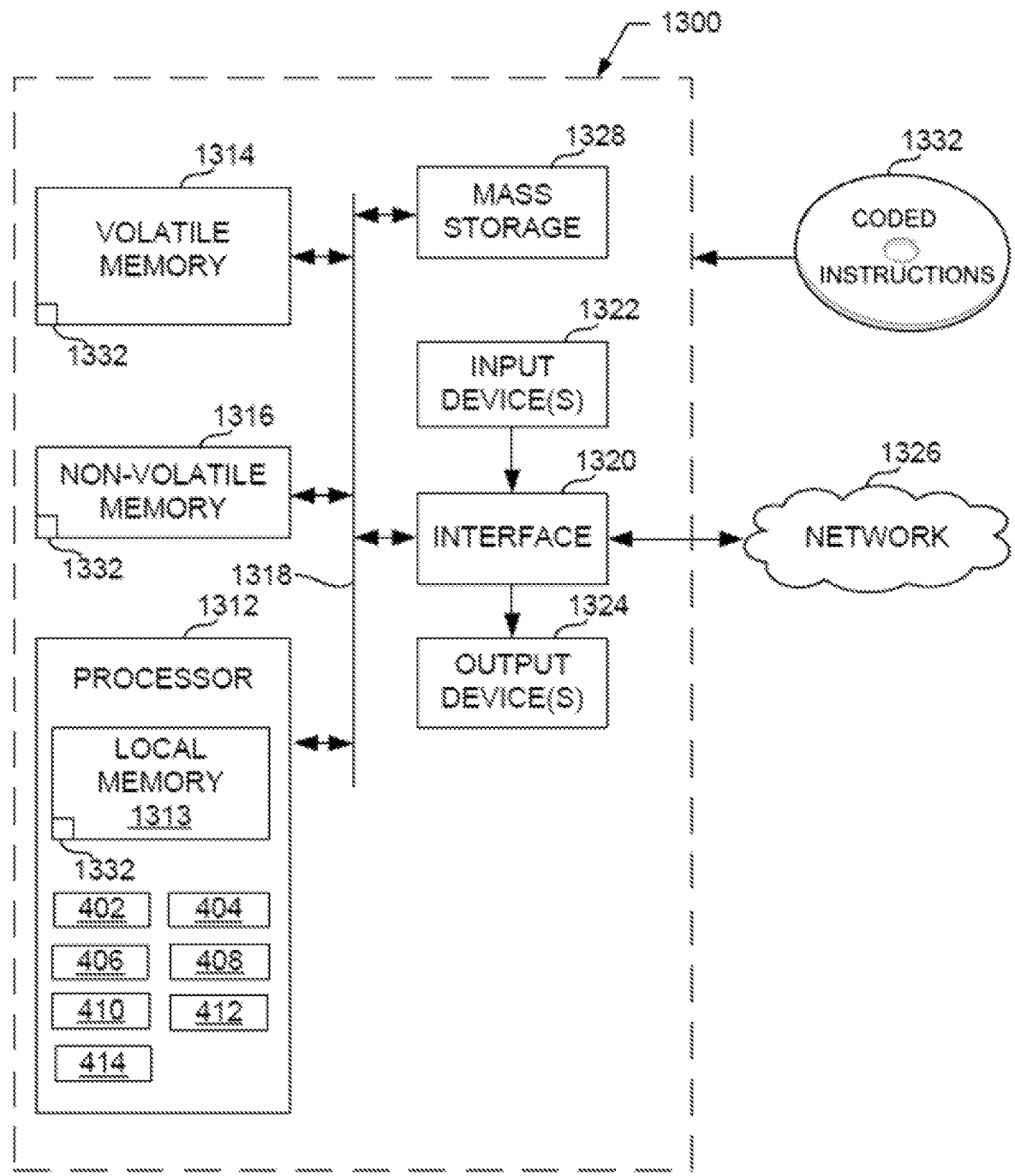
FIG. 13 is a block diagram of an example machine that may be used to implement the example methods and apparatus disclosed herein.

FIG. 13 is a block diagram of an example processor platform 1300 structured to execute the instructions to implement the display controller of FIG. 4. The processor platform 1300 can be, for example, a server, a personal computer, a workstation, a self-learning machine (e.g., a neural network), a mobile device (e.g., a cell phone, a smart phone, a tablet computer), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1300 of the illustrated example includes a processor 1312. The processor 1312 of the illustrated example is hardware. For example, the processor 1312 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the image generator, the camera detector, the timing controller, the first gate driver, the second gate driver, and the source driver.

The processor 1312 of the illustrated example includes a local memory 1313 (e.g., a cache). The processor 1312 of the illustrated example is in communication with a main memory including a volatile memory 1314 and a non-volatile memory 1316 via a bus 1318. The volatile memory 1314 may be implemented by Synchronous Dynamic Random Access Memory (SDRAM), Dynamic Random Access Memory (DRAM), RAMBUS® Dynamic Random Access Memory (RDRAM®), and/or any other type of random access memory device. The non-volatile memory 1316 may be implemented by flash memory and/or any other desired type of memory device. Access to the main memory 1314, 1316 is controlled by a memory controller.

The processor platform 1300 of the illustrated example also includes an interface circuit 1320. The interface circuit 1320 may be implemented by any type of interface standard, such as an Ethernet interface, a universal serial bus (USB), a Bluetooth® interface, a near field communication (NFC) interface, and/or a PCI express interface.

In the illustrated example, one or more input devices 1322 are connected to the interface circuit 1320. The input device(s) 1322 permit(s) a user to enter data and/or commands into the processor 1312. The input device(s) can be implemented by, for example, an audio sensor, a microphone, a camera (still or video), a keyboard, a button, a mouse, a touchscreen, a track-pad, a trackball, isopoint, and/or a voice recognition system.

One or more output devices 1324 are also connected to the interface circuit 1320 of the illustrated example. The output devices 1324 can be implemented, for example, by display devices (e.g., a light emitting diode (LED), an organic light emitting diode (OLED), a touchscreen, etc.), a tactile output device, a printer, and/or speaker. The interface circuit 1320 of the illustrated example, thus, typically includes a graphics driver card, a graphics driver chip, and/or a graphics driver processor.

The interface circuit 1320 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1326. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1300 of the illustrated example also includes one or more mass storage devices 1328 for storing machine -readable instructions and/or data. Examples of such mass storage devices 1328 include floppy disk drives, hard drive disks, compact disk drives, Blu-ray disk drives, redundant array of independent disks (RAID) systems, and digital versatile disk (DVD) drives.

The machine executable instructions 1332 to implement the display controller 218 may be stored in the mass storage device 1328, in the volatile memory 1314, in the non-volatile memory 1316, and/or on a removable non-transitory computer readable storage medium such as a CD or DVD.

From the foregoing, it will be appreciated that the disclosed methods, apparatus, and articles of manufacture enable a camera of an electronic device to be positioned behind a display to reduce a border or edge adjacent the display that would otherwise be needed to accommodate the camera. The example methods, apparatus, and articles of manufacture disclosed herein enable use of a transparent, conductive material(s) to support source lines and gate lines of a display. Additionally, the gate lines and source lines incorporating the transparent portions can be electrically isolated and/or controlled independently from each other to prevent degradation of signals or commands when driving pixels associated with or corresponding to gate lines and the source lines, thereby improving accuracy and/or quality of an image presented on the display.

"Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed:

1. A display comprising:
   a first portion defining a non-transparent area and a second portion defining a transparent area;
   a source line including a first portion composed of a first non-transparent material and a second portion composed of a first transparent material;
   a first gate line including a first portion composed of a second non-transparent material and a second portion composed of a second transparent material; and
   a second gate line including a first portion composed of the second non-transparent material and a second portion composed of the second transparent material,
   wherein the first portion of the source line, the first portion of the first gate line, and the first portion of the second gate line at least partially extend within a perimeter defining the non-transparent area of the display, and
   wherein the second portion of the source line, the second portion of the first gate line, and second portion of the second gate line at least partially extend within a perimeter defining the transparent area of the display.

2. The display of claim 1, further comprising a source driver to control the source line.

3. The display of claim 1, further including:
   a first gate driver to control the first gate line; and
   a second gate driver to control the second gate line.

4. The display of claim 3, wherein the first gate driver controls the first gate line independently from the second gate driver controlling the second gate line.

5. The display of claim 3, wherein the first gate driver controls only the first gate line and the second gate driver controls only the second gate line such that the first gate driver does not control the second gate line and the second gate driver does not control the first gate line.

6. The display of claim 1, further including a gap between the first gate line and the second gate line.

7. The display of claim 1, further including a camera disposed under the transparent area.

8. The display of claim 1, wherein the first non-transparent material and the second non-transparent material are the same material.

9. The display of claim 1, wherein the first transparent material and the second transparent material are the same material.

10. The display of claim 1, wherein at least one of the first non-transparent material or the second non-transparent material includes metal, and wherein at least one of the first transparent material or the second transparent material includes at least one indium tin oxide, indium zinc oxide, or indium gallium zinc oxide.

11. The display of claim 1, wherein the transparent area is located immediately adjacent an edge a bezel of the display.

12. The display of claim 1, wherein the transparent area is located adjacent a central area of the display.

13. A display comprising:
a plurality of source lines including a first source line composed of an opaque material and a transparent material, and a second source line different than the first source line composed of the opaque material;
a first set of gate lines including a first gate line composed of the opaque material and the transparent material, and a second gate line composed of the opaque material; and
a second set of gate lines including a third gate line composed of the opaque material and the transparent material, and a fourth gate line composed of the opaque material, the transparent material of the first source line, the first gate line, and the third gate line define a transparent area of the display.

14. The display of claim 13, wherein the first set of gate lines is electrically isolated from the second set of gate lines.

15. The display of claim 13, further including a source driver to control the source lines, a first gate driver to control the first set of gate lines, and a second gate driver to control the second set of gate lines.

16. The display of claim 13, further including a camera positioned at least partially within a perimeter of the transparent area of the display, the camera to capture an image when light passes through the transparent area.

17. A display comprising:
a first portion defining an opaque area and a second portion defining a transparent area of the display;
a source line including a first portion composed of a first opaque material having a first resistivity and a second portion composed of a first transparent material, the first transparent material having a second resistivity different than the first resistivity, the first portion of the source line located in the opaque area and the second portion of the source line located in the transparent area;
a first gate line including a first portion composed of a second opaque material having a third resistivity and a second portion composed of a second transparent material, the second transparent material having a fourth resistivity different than the third resistivity, the first portion of the first gate line located in the opaque area and the second portion of the first gate line located in the transparent area;
a second gate line including a first portion composed of the second opaque material and a second portion composed of the second transparent material, the first portion of the second gate line located in the opaque area and the second portion of the second gate line located in the transparent area; and
a camera positioned within the transparent area of the display and disposed adjacent the second portion of the source line, the second portion of the first gate line, and second portion of the second gate line.

18. The display of claim 17, wherein the second resistivity is greater than the first resistivity, and the fourth resistivity is greater than the third resistivity.

19. The display of claim 17, wherein the second portion of the source line, the second portion of the first gate line, and second portion of the second gate line define the transparent area of the display.

20. The display of claim 17, wherein the second portion of the source line, the second portion of the first gate line, and second portion of the second gate line at least partially extend within a perimeter defining the transparent area of the display.

* * * * *